(12) United States Patent
Tamura

(10) Patent No.: US 9,086,463 B2
(45) Date of Patent: Jul. 21, 2015

(54) POWER SUPPLY APPARATUS
(75) Inventor: Hideki Tamura, Shiga (JP)
(73) Assignee: PANASONIC INTELLECTUAL PROPERTY MANAGEMENT CO., LTD., Osaka (JP)
( * ) Notice: Subject to any disclaimer, the term of this patent is extended or adjusted under 35 U.S.C. 154(b) by 540 days.
(21) Appl. No.: 13/503,434
(22) PCT Filed: Oct. 20, 2010
(86) PCT No.: PCT/IB2010/002681
§ 371 (c)(1), (2), (4) Date: Jun. 21, 2012
(87) PCT Pub. No.: WO2011/048471
PCT Pub. Date: Apr. 28, 2011

(65) Prior Publication Data
US 2012/0248876 A1      Oct. 4, 2012

(30) Foreign Application Priority Data
Oct. 23, 2009  (JP) ................................ 2009-244963

(51) Int. Cl.
*H02J 7/00* (2006.01)
*G01R 31/36* (2006.01)
(52) U.S. Cl.
CPC ................................. *G01R 31/3679* (2013.01)
(58) Field of Classification Search
CPC ........... H02J 9/00; H02J 7/004; H02J 7/0008; B06L 11/1851; B06L 11/1611; G06F 1/3265
USPC .......................... 320/107, 118–121, 127–136
See application file for complete search history.

(56) References Cited

U.S. PATENT DOCUMENTS

| | | | | |
|---|---|---|---|---|
| 5,018,148 A | * | 5/1991 | Patel et al. | ....................... 714/22 |
| 5,606,242 A | * | 2/1997 | Hull et al. | ..................... 320/106 |
| 6,097,176 A | * | 8/2000 | Yao et al. | ....................... 320/132 |
| 2005/0083017 A1 | | 4/2005 | Suzuki | |
| 2005/0088100 A1 | * | 4/2005 | Chen et al. | ....................... 315/86 |
| 2007/0046263 A1 | | 3/2007 | Matsushima et al. | |
| 2008/0303527 A1 | * | 12/2008 | Fechalos et al. | ............. 324/426 |
| 2010/0241376 A1 | | 9/2010 | Kikuchi et al. | |

FOREIGN PATENT DOCUMENTS

| | | |
|---|---|---|
| CN | 1084281 A | 3/1994 |
| CN | 1916653 A | 2/2007 |
| CN | 101004629 A | 7/2007 |
| JP | H1152033 A | 2/1999 |
| JP | 3322116 | 6/2002 |
| JP | 2005-83970 A | 3/2005 |
| JP | 2006177764 A | 7/2006 |
| JP | 2007166789 A | 6/2007 |
| JP | 2009-12345 A | 6/2009 |

OTHER PUBLICATIONS

Chinese Office Action dated Dec. 10, 2014 issued in corresponding Chinese application No. 201080047099.0 and the English search report thereof. The International Search Report for PCT/IB2010/002681, (Nov. 8 , 2010).
Chinese Office Action dated Dec. 23, 2013 issued in corresponding Chinese application No. 201080047099.0 and the English summary and search report thereof.
Japanese Office Action dated Feb. 4, 2014 issued in corresponding Japanese application No. 2009-244963 and the English summary thereof.

* cited by examiner

*Primary Examiner* — Paul Dinh
(74) *Attorney, Agent, or Firm* — Bacon & Thomas, PLLC

(57) ABSTRACT

A power supply apparatus includes a secondary battery and a timer unit for measuring a time required to charge the secondary battery from a first State Of Charge (SOC) to a second SOC, or a time required to discharge the second battery from the second SOC to the first SOC. The power supply apparatus further includes a determination unit for determining a degraded state of the secondary battery based on results of the measurement by the timer unit.

12 Claims, 7 Drawing Sheets

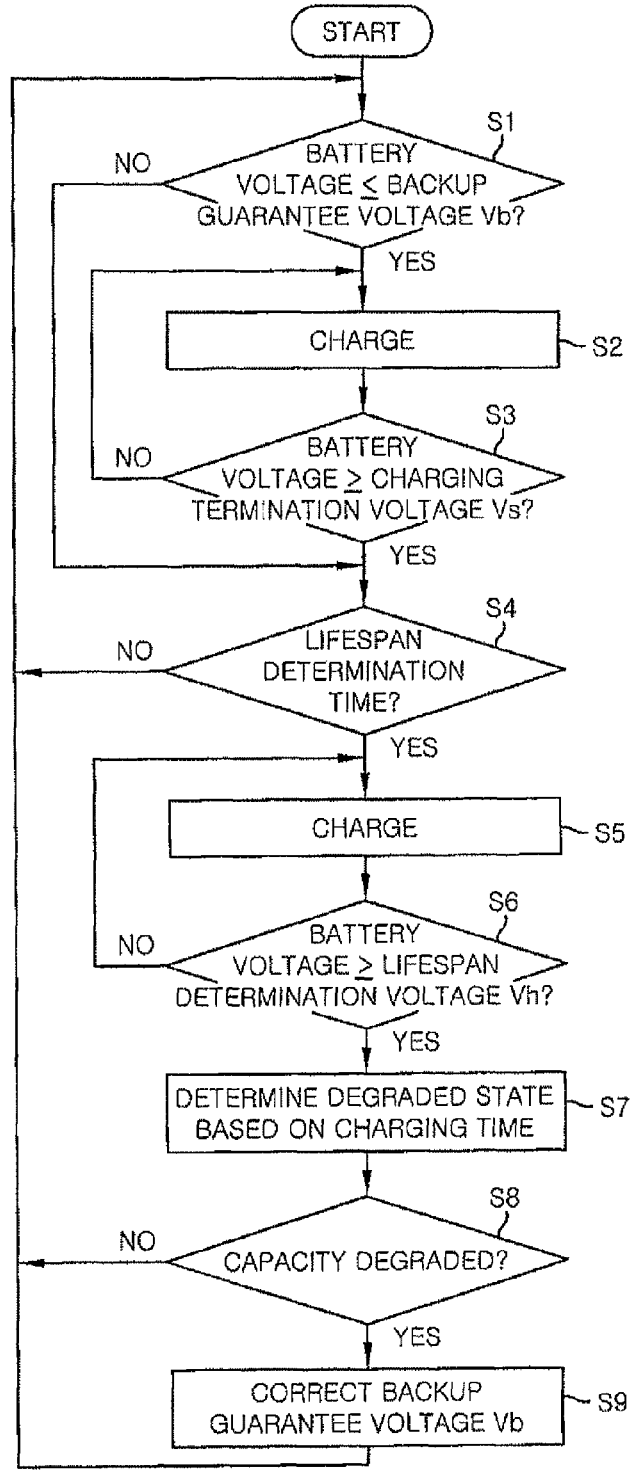

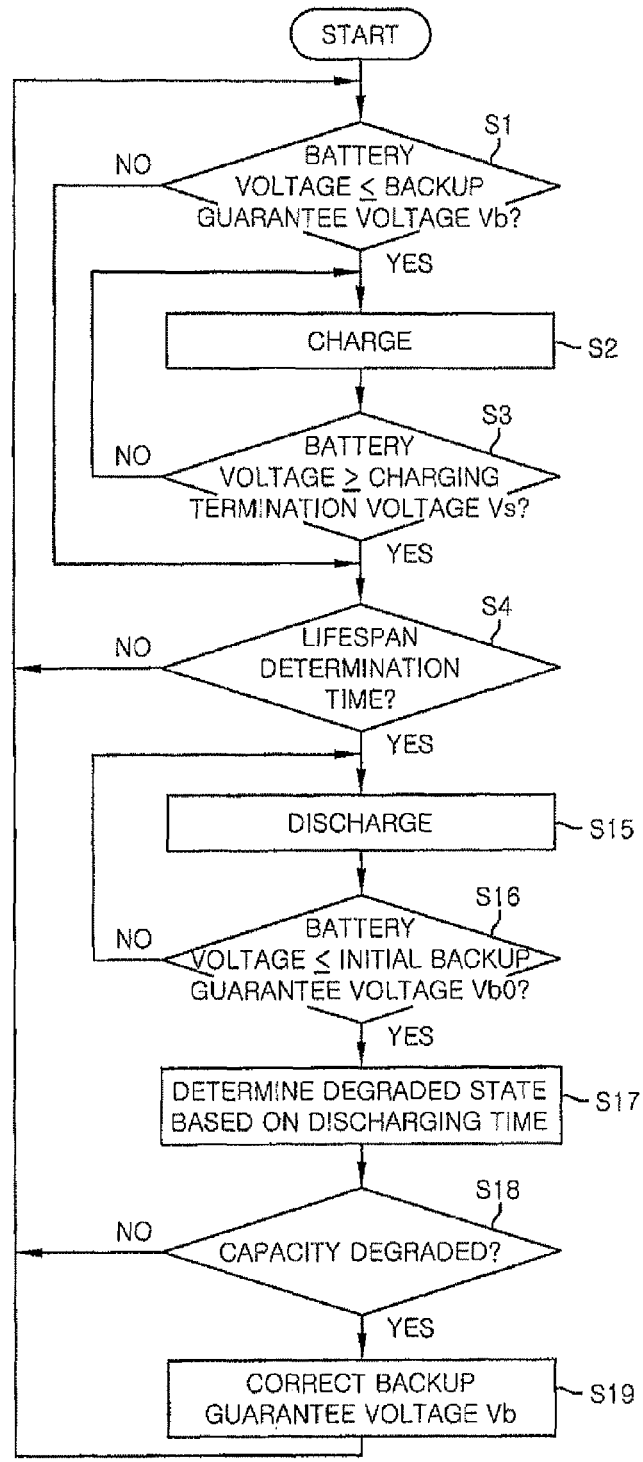

POWER SUPPLY APPARATUS

FIELD OF THE INVENTION

The present invention relates to a power supply apparatus.

BACKGROUND OF THE INVENTION

There is disclosed a power supply apparatus that includes a secondary battery used as a backup power source upon a power failure and supplies power from the secondary battery to load appliances in the event of a power failure (see, e.g., Japanese Patent No. 3322116).

A secondary battery needs to be periodically replaced because the capacity (Wh) thereof decreases with an increased use time. For example, since a secondary battery such as in a mobile phone is used while being repeatedly charged and discharged, the capacity of the secondary battery can be easily detected from the amount of discharged electricity and discharging time, or the amount of charged electricity and charging time. Therefore, the degree of the decrease in capacity relative to initial capacity is detected to determine the degraded state of the secondary battery, so that it is possible to detect the lifespan of the battery.

Meanwhile, since a secondary battery used as a backup power source upon a power failure is typically rarely charged or discharged except for a self-discharge portion, it is difficult to check the capacity of the battery. Further, since the secondary battery is used as a backup power source upon a power failure, it is impossible to check the capacity by discharging the secondary battery until the capacity thereof is decreased to about zero. Therefore, there is a need to check the capacity and to determine the degraded state of the secondary battery when the secondary battery is not in use while a power failure is not occurred.

As a test method of determining the degraded state of a secondary battery, there has been proposed a method for determining the degraded state of the secondary battery based on the voltage of the secondary battery obtained after a period of time has elapsed from the start of discharging as disclosed in Japanese Patent No. 3322116. However, this method determines degradation based on a variation in voltage before and after the discharging of the secondary battery and does not take into consideration charging/discharging time that varies with the degraded state of the battery.

SUMMARY OF THE INVENTION

In view of the above, the present invention provides a power supply apparatus capable of determining the degraded state of a secondary battery in consideration of the charging/discharging time.

In accordance with an aspect of the present invention, there is provided a power supply apparatus including: a secondary battery; a timer unit for measuring a time required to charge the secondary battery from a first State Of Charge (SOC) to a second SOC, or a time required to discharge the second battery from the second SOC to the first SOC; and a determination unit for determining a degraded state of the secondary battery based on results of the measurement by the timer unit.

The power supply apparatus may further includes: a charging unit for charging the secondary battery; a discharging unit for discharging the secondary battery; and a charging/discharging control unit for controlling charging of the secondary battery by using the charging unit and discharging of the secondary battery by using the discharging unit, wherein charging/discharging control unit controls the charging unit so that, at a predetermined timing, the secondary battery is charged from the first SOC to the second SOC, or controls the discharging unit so that, at the predetermined timing, the secondary battery is discharged from the second SOC to the first SOC.

With such configuration, it is possible to determine the degraded state of the secondary battery in consideration of the charging/discharging time.

Further, the determination unit may store, as an initial time required, the time required to charge the initial secondary battery from the first SOC to the second SOC, or the time required to discharge the initial secondary battery from the second SOC to the first SOC, and then determines the degraded state of the secondary battery by comparing the results of the measurement by the timer unit with the initial time required.

With such configuration, the degraded state of the secondary battery can be determined and the determination can be simplified by comparing the charging/discharging time with the initial charging/discharging time.

Further, the determination unit may store a capacity of the secondary battery, obtained when the initial secondary battery is in the second SOC, as an initial capacity, derives the capacity of the secondary battery in the second SOC based on the results of the measurement by the timer unit, and determines the degraded state of the secondary battery by comparing the derived capacity of the secondary battery with the initial capacity.

With such configuration, the degraded state of the secondary battery can be determined by comparing the capacity of the secondary battery, which is derived based on the charging/discharging time, with the initial capacity of the secondary battery.

Further, the secondary battery may be charged to a predetermined capacity or more and is then used as a backup power source for supplying power to a load appliance in case of emergency, and the charging/discharging control unit may charge the secondary battery to a backup guarantee SOC or more, and vary the backup guarantee SOC so that the capacity of the secondary battery becomes, the predetermined capacity or more depending on the degraded state of the secondary battery determined by the determination unit.

With such configuration, the capacity of the secondary battery required for backup can be secured regardless of the degraded state of the secondary battery.

Further, the charging/discharging control unit may control charging/discharging so that an upper limit of the SOC of the secondary battery is less than 100%, and charges the secondary battery from the first SOC of less than 100% to the second SOC of 100% or discharges the secondary battery from the second SOC of 100% to the first SOC of less than 100%, at the predetermined timing.

With such configuration, since the degradation of capacity of the secondary battery speeds up as the residual capacity of the secondary battery is higher, the secondary battery is charged up to SOC 100% only when the degraded state of the secondary battery is determined, thus promoting the lengthening of the lifespan of the secondary battery.

Further, the secondary battery may be charged to a predetermined capacity or more and is used as a backup power source for supplying power to a load appliance in case of emergency, and the charging/discharging control unit may charge the secondary battery to a backup guarantee SOC or more, and vary the backup guarantee SOC so that the capacity of the secondary battery becomes the predetermined capacity or more depending on a temperature of the secondary battery.

With such configuration, the capacity of the secondary battery required for backup can be secured regardless of the temperature of the secondary battery.

As described above, the present invention is advantageous in that the degraded state of the secondary battery can be determined in consideration of the charging/discharging time.

BRIEF DESCRIPTION OF THE DRAWINGS

The objects and features of the present invention will be apparent from the following description of embodiments when taken in conjunction with the accompanying drawings, in which:

FIG. 4 is an operating flowchart showing the first embodiment;

FIG. 9 is an operating flowchart showing a second embodiment of the present invention; and FIGS. 10A, 10B and 100 are diagrams showing the determining operation and the correcting operation of the second embodiment.

DETAILED DESCRIPTION OF THE PREFERRED EMBODIMENTS

Figure 1:
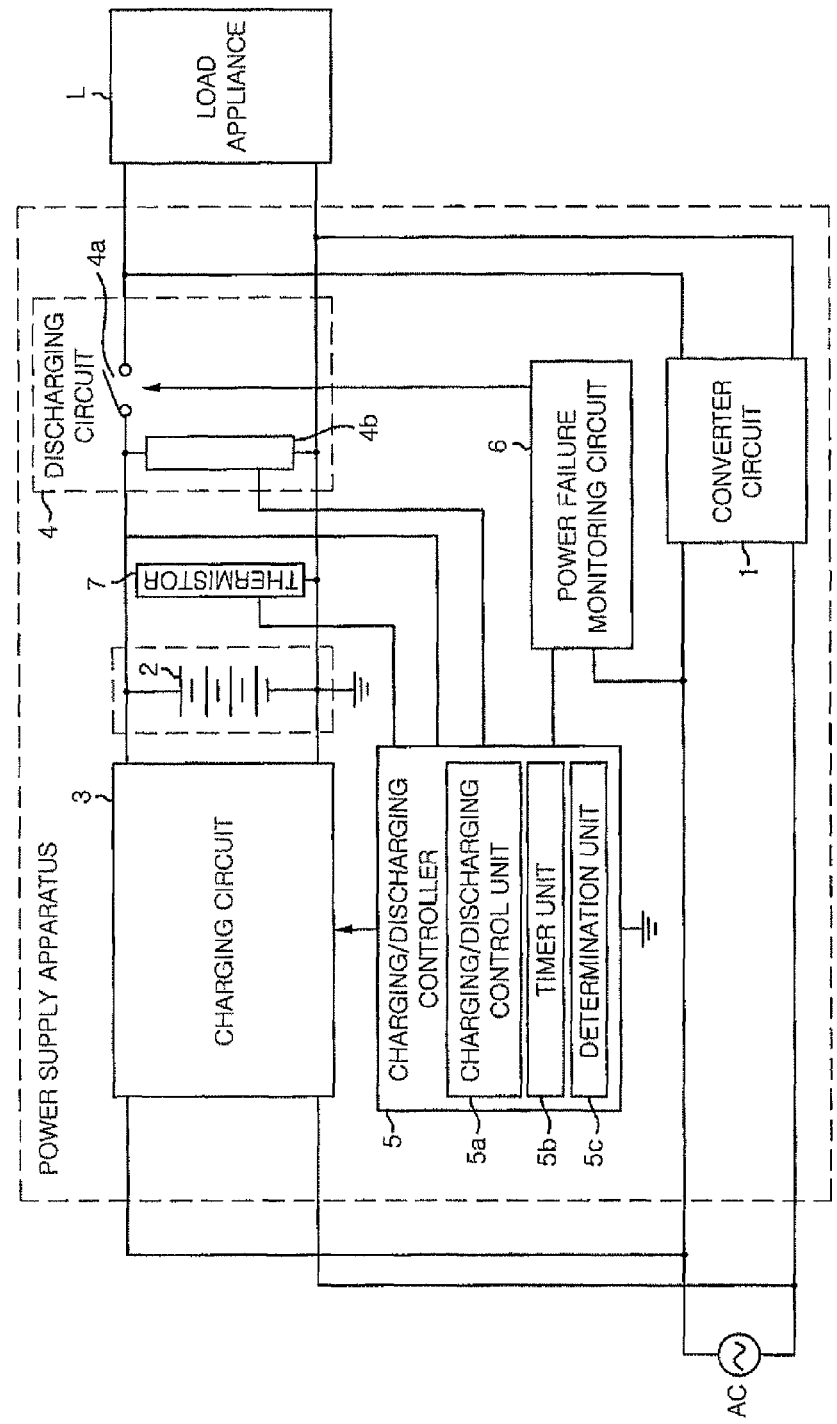
FIG. 1 is a diagram showing the configuration of a power supply apparatus according to a first embodiment of the present invention.

Embodiments of the present invention will be described in detail below with reference to the accompanying drawings that constitute a part hereof. The same reference numerals will be assigned to the same or similar components throughout the drawings, and redundant descriptions thereof will be omitted.

First Embodiment

As shown in FIG. 1, a power supply apparatus according to the present embodiment includes a converter circuit 1 (AC/DC conversion unit) for performing AC/DC conversion to convert the power of an alternating current (AC) power source AC, implemented as a commercial power source, into DC power and supplying the DC power to a load appliance L; a secondary battery 2 functioning as a backup power source when a power failure occurs in the AC power source AC; a charging circuit 3 (charging unit) for performing AC/DC conversion to convert the power of the AC power source AC into DC power and charging the secondary battery 2 with constant current; a discharging circuit 4 (discharging unit) for discharging the secondary battery 2; a charging/discharging controller 5 for controlling the respective operations of the charging circuit 3 and the discharging circuit 4; a power failure monitoring circuit 6 (power failure monitoring unit) for detecting a power failure in the AC power source AC; and a thermistor 7 for detecting the environmental temperature of the secondary battery 2.

The charging/discharging controller 5 includes a charging/discharging control unit 5a (charging/discharging control unit), a timer unit 5b (timer unit), and a determination unit 5c (determination unit). The power failure monitoring circuit 6 detects the occurrence of a power failure based on the voltage of the AC power source AC, and then determines that a power failure has occurred when the voltage of the AC power source AC becomes less than a predetermined value. Further, the discharging circuit 4 includes an output switch 4a (power switching unit) connected in series to a power supply path from the secondary battery 2 to the load appliance L and a compulsory discharging circuit 4b (power consuming unit) connected between both ends of the secondary battery 2. The output switch 4a is ON/OFF-controlled by the power failure monitoring circuit 6, and the compulsory discharging circuit 4b is controlled to be driven by the charging/discharging control unit 5a.

Further, during a normal period in which the power failure monitoring circuit 6 does not detect a power failure in the AC power source AC, the load appliance L is driven by the DC power output from the converter circuit 1. The charging/discharging control unit 5a charges the secondary battery 2 with constant current by operating the charging circuit 3 as needed in order to maintain the voltage of the secondary battery 2 at a predetermined voltage. Further, the power failure monitoring circuit 6 controls the output switch 4a to be turned off (opened), and the charging/discharging control unit 5a operates the compulsory discharging circuit 4b. The compulsory discharging circuit 4b has the function of compulsorily keeping the secondary battery 2 in a discharge state of a predetermined capacity by connecting a dummy load such as a resistor (not shown) between both ends of the secondary battery 2. During a normal period (a state in which current flows through the AC power source AC), the secondary battery 2 is compulsorily kept in a discharge state, thus preventing the instantaneous interruption of the load appliance L from occurring when the output switch 4a is ON-controlled upon detecting a power failure, which will be described later.

Next, in case of emergency in which the power failure monitoring circuit 6 detects a power failure occurring in the AC power source AC, the power failure monitoring circuit 6 controls the output switch 4a to be turned on, and also outputs a power failure occurrence signal to the charging/discharging control unit 5a. The charging/discharging control unit 5a that has received the power failure occurrence signal stops the compulsory discharging circuit 4b and allows DC power to be supplied from the secondary battery 2 to the load appliance L via the output switch 4a.

In order for the secondary battery 2 to function as the backup power source of the load appliance L in the event of a power failure, a residual capacity enabling the supply of power is required at least during a period in which backup is guaranteed. When the power consumption of the load appliance L in the present embodiment is 50 W and a backup guarantee period is 1 hour (1 h), a residual capacity of 50 W×1 h=50 Wh is required. Therefore, when the capacity of the secondary battery 2, used for backup, in the State Of Charge (SOC) 100% is assumed to be 100 Wh, SOC 50% is required.

Figure 2:
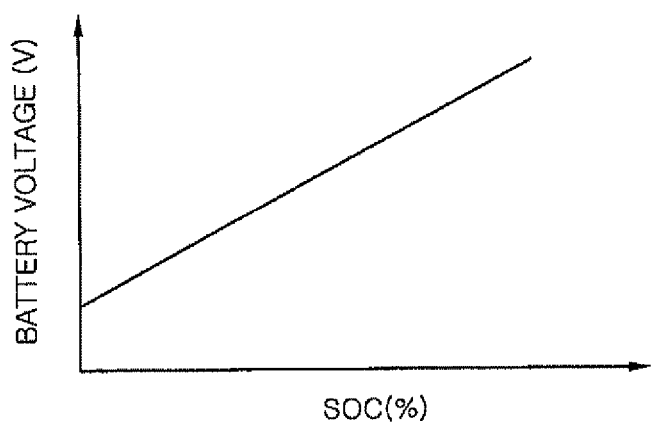
FIG. 2 is a diagram showing a relationship between the State Of Charge (SOC) and the battery voltage of a lithium-ion battery.

In this case, when the secondary battery 2 is implemented as a lithium-ion battery, the proportional relationship shown in FIG. 2 is present between the SOC and the voltage of the secondary battery 2 (hereinafter, referred to as a "battery voltage"). The charging/discharging control unit 5a detects the SOC of the secondary battery 2 by monitoring the battery voltage. Further, the charging/discharging control unit 5a according to the present embodiment starts to charge the secondary battery 2 by using the charging circuit 3 if the SOC of the secondary battery 2 decreases to 50% during the normal period, and stops the charging circuit 3 if the SOC reaches a predetermined value (for example, 60%). Alternatively, discharging power by the compulsory discharging circuit 4b may be compensated by charging the secondary battery and the SOC to maintain SOC 50%.

Figure 3:
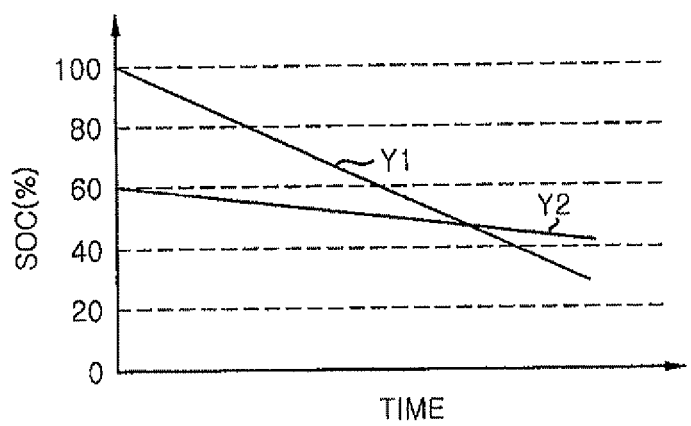
FIG. 3 is a diagram showing the capacity degradation characteristics of a lithium-ion battery.

Further, as shown in FIG. 3, in the cases where the secondary battery 2 implemented as a lithium-ion battery is kept in SOC 100% (characteristic Y1) and in SOC 60% (characteristic Y2), the former case corresponding to the SOC 100% causes the degradation of capacity to proceed faster. That is, in the degradation of the capacity of the secondary battery 2, as the residual capacity is higher, the speed of degradation becomes higher. Therefore, in order to lengthen the lifespan of the secondary battery 2, the secondary battery is suppressed to a low SOC of about 50 to 60% to guarantee the lifespan without being charged up to SOC 100%.

Further, in the present embodiment, during the normal period in which the secondary battery 2 is not used as the backup power source (a state in which current flows through the AC power source AC), the charging/discharging controller 5 determines the degraded state of the secondary battery 2. The flowchart of the operations of the power supply apparatus performed during the normal time is shown in FIG. 4.

First, the charging/discharging control unit 5a determines whether the battery voltage is equal to or less than a battery voltage corresponding to a backup guarantee SOC (for example, 50% in an initial state) set for the guarantee of backup (hereinafter, referred to as a "backup guarantee voltage Vb") (step S1). If the battery voltage is equal to or less than the backup guarantee voltage Vb, the charging of the secondary battery 2 starts by using the charging circuit 3 (step S2). It is determined whether the battery voltage has reached a battery voltage corresponding to a charging termination SOC (for example, 60%) preset for the guarantee of lifespan (hereinafter, referred to as a "charging termination voltage Vs") (step S3). If the battery voltage is less than the charging termination voltage Vs, the charging operation continues to be performed. Further, if the battery voltage is greater than the backup guarantee voltage Vb at step S1, or if the battery voltage has reached the charging termination voltage Vs at step S3, it is determined whether the time to determine the lifespan of the secondary battery 2 has been reached (step S4). The lifespan determination time for the secondary battery 2 is set at predetermined regular periods (for example, once a month), so that the process returns to step S1 to repeat the above process if the lifespan determination time has not been reached.

If the lifespan determination time for the secondary battery 2 has been reached, the charging/discharging control unit 5a makes the battery voltage identical to an initial backup guarantee voltage Vb0 by using the charging circuit 3 or the discharging circuit 4, and thereafter starts to charge the secondary battery 2 by using the charging circuit (step S5). The charging/discharging control unit 5a determines whether the battery voltage has reached a battery voltage corresponding to a second SOC (for example, 100%) preset for the determination of lifespan (hereinafter, referred to as a "lifespan determination voltage Vh") (step S6). If the battery voltage is less than the lifespan determination voltage Vh, the charging operation continues to be performed. The timer unit 5b measures the time required to perform charging from the initial backup guarantee voltage Vb0 to the lifespan determination voltage Vh (charging time), and the determination unit 5c determines the degraded state of the secondary battery 2 based on the charging time if it is determined at step S6 that the battery voltage has reached the lifespan determination voltage Vh (step S7). In this case, the initial backup guarantee voltage Vb0 is a backup guarantee voltage set for the initial secondary battery 2 (the battery voltage corresponding to a first SOC (for example, SOC 50%) identical to an initial backup guarantee SOC).

Figure 5A:
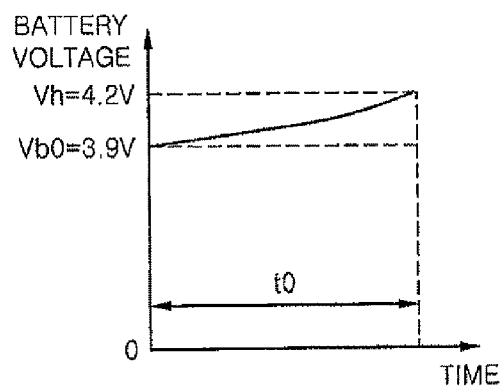
FIGS. 5A, 5B and 5C are diagrams showing the determining operation and the correcting operation of the first embodiment.
Figure 5B:
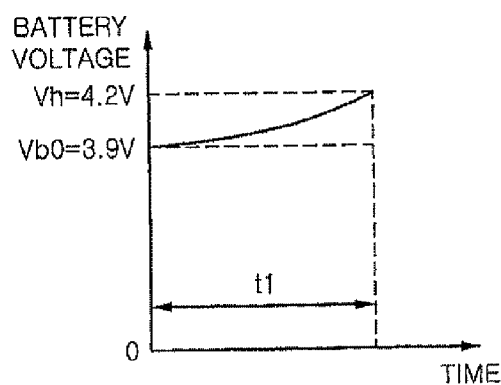

Hereinafter, a determination process for determining the degraded state of the secondary battery 2 in consideration of charging time will be described in detail. First, as shown in FIG. 5B, if a battery voltage of 3.9V corresponding to first SOC 50% is an initial backup guarantee voltage Vb0 and a battery voltage of 4.2V corresponding to second SOC 100% is a lifespan determination voltage Vh, the charging time (the measured charging time) from the initial backup guarantee voltage Vb0 to the lifespan determination voltage Vh is assumed to be t1.

Further, the determination unit 5c stores the initial charging time t0 (the initial time required) it takes the initial secondary battery 2 to be charged in a range of SOC 50% to 100%, and determines the degraded state of the secondary battery 2 on the basis of the ratio of the measured charging time t1 to the initial charging time t0 (t1/t0). In this case, the degraded state is represented by the following Equation (1):

$$\text{Degraded state} = t1/t0 \quad (1)$$

As t1/t0 becomes less than 1, the secondary battery 2 is determined to be gradually degraded. In this case, the process can be simplified compared to the determination process based on the capacity of the secondary battery 2, which will be described below.

Further, the determination unit 5c may determine the degraded state of the secondary battery 2 on the basis of the capacity of the secondary battery 2 that is derived in consideration of the charging time. First, as shown in FIG. 5B, it is assumed that when a battery voltage of 3.9V corresponding to the first SOC 50% is an initial backup guarantee voltage Vb0, a battery voltage of 4.2V corresponding to the second SOC 100% is a lifespan determination voltage Vh, charging power for constant current charging performed by the charging circuit 3 is P1 W, and the charge SOC that is a charge portion of SOC is 50% (−100%-50%), the charging time (the measured charging time) from the initial backup guarantee voltage Vb0 to the lifespan determination voltage Vh is t1. In this case, the capacity C1 (Wh) of the current secondary battery 2 in SOC 100% (hereinafter, referred to as a "measured capacity C1") is given by the following Equation (2):

$$C1(Wh) = t1(h) \times P1(W) \div \text{charge SOC}(\%) \times 100 \quad (2)$$

Further, the determination unit 5c previously stores the capacity C2 (Wh) of the initial secondary battery 2 in SOC 100% (hereinafter referred to as an "initial capacity C0"), and the degraded state of the secondary battery 2 is represented by the following Equation (3):

$$\text{degraded state} = C1/C0 \quad (3)$$

That is, as C1/C0 becomes less than 1, the secondary battery 2 is determined to be degraded. In this way, by comparing the capacity C1 of the secondary battery 2 that is derived based on the charging time with the initial capacity C0, it is possible to determine the degraded state of the secondary battery 2.

Also, for the initial capacity C0 (Wh) of the secondary battery 2, the initial charging time t0 may be measured by using the initial secondary battery 2 (see FIG. 5A), and results obtained by calculating the following Equation (4) may be stored.

$$C0(Wh)=t0(h)\times P1(W)\div \text{charge SOC}(\%) \times 100 \quad (4)$$

Further, the lifespan determination voltage Vh may be set to a battery voltage corresponding to, for example, SOC 60%, rather than SOC 100%. However, since the charging time is decreased, charging to a higher SOC level is more profitable from the standpoint of the accuracy of the determination.

Furthermore, the determination unit 5c determines whether the degraded state of the secondary battery 2 is in progress, based on the degraded state of the secondary battery 2 obtained in the above Equation (1) or (3) (step S8). When the degraded state has decreased to 0.9, the measured capacity C1 is decreased to 90% of the initial capacity C0, so that capacity in SOC 100% is 90 Wh. Therefore, in order to secure a capacity of 50 Wh required for backup, a backup guarantee SOC of 56% is required.

Figure 5C:
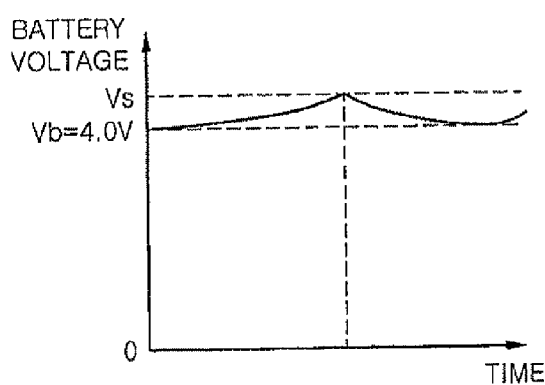

Therefore, the charging/discharging control unit 5a sets the backup guarantee voltage Vb tp 4.0V corresponding to the backup guarantee SOC 56%, and then corrects the backup guarantee voltage Vb depending on the degraded state of the secondary battery 2 (step S9). Further, with the correction of the backup guarantee voltage Vb, the charging termination voltage Vs is also corrected. Thereafter, the charging/discharging control unit 5a controls charging/discharging during the normal period at steps S1 to S3 by using the corrected backup guarantee voltage Vb and the corrected charging termination voltage Vs (see FIG. 5C), thus securing a capacity of 50 Wh required for backup regardless of the degraded state of the secondary battery 2. That is, the charging/discharging control unit 5a sets the SOC of the secondary battery 2 for the normal period, depending on the degraded state of the secondary battery 2 determined by the determination unit 5c.

Further, the correction of the backup guarantee voltage Vb at steps S5 to S9 is periodically performed, and thus the correction of the charging termination voltage Vs is performed accordingly. When the measured capacity C1 (Wh) of the secondary battery 2 in the SOC 100%, after charging, decreases to 55 Wh, a notification of this decrease is provided to the user by using a notification unit (not shown) such as an indication lamp or a buzzer, and the user is prompted to replace the secondary battery 2.

Figure 6:
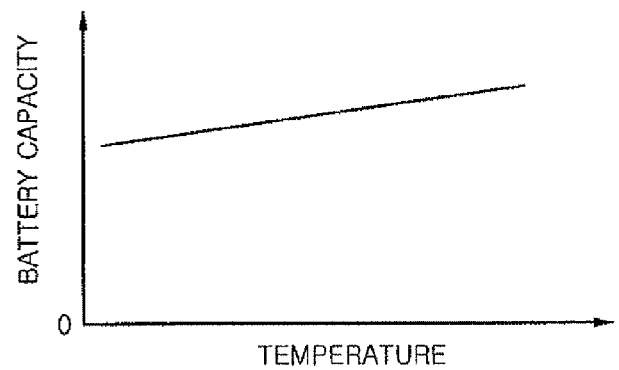
FIG. 6 is a diagram showing a relationship between the temperature and the battery capacity of a secondary battery.
Figure 7:
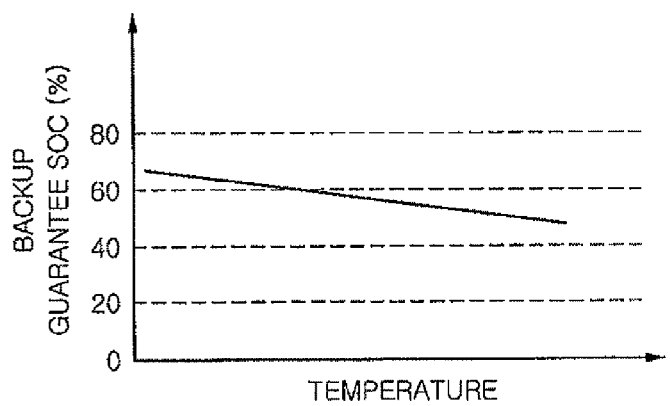
FIG. 7 is a diagram showing a relationship between the temperature and the required SOC of the secondary battery.

Further, a relationship between the temperature and the battery capacity of the secondary battery 2 shows that as the battery temperature becomes lower, the battery capacity becomes lower, as shown in FIG. 6. Therefore, in the case where temperature correction is not performed, there is a fear that the capacity (Wh) required for backup cannot be secured if the temperature of the secondary battery 2 decreases. Therefore, the charging/discharging control unit 5a stores, as the temperature characteristics of the secondary battery 2, a relationship between the temperature of the secondary battery and the backup guarantee SOC needed to secure the capacity (Wh) required for backup, as shown in FIG. 7. Further, the temperature characteristics of the secondary battery 2 shown in FIG. 7 vary depending on the degraded state of the secondary battery 2 in such a way that, for example, when the degraded state is in progress, the capacity (Wh) required for backup increases. Therefore, in the present embodiment, a single temperature characteristic pattern for each degraded state of the secondary battery 2 is stored and a component for varying the temperature characteristic pattern depending on the degraded state of the secondary battery 2 is provided.

Figure 8:
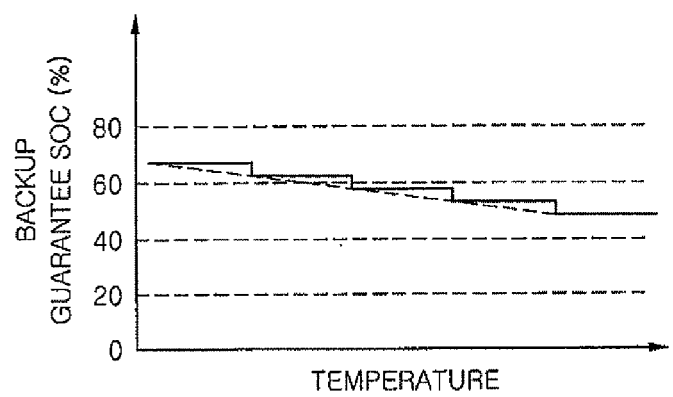
FIG. 8 is a diagram showing a simplified relationship between the temperature and the required SOC of the secondary battery.

Further, the environmental temperature of the secondary battery 2 having a correlation with the temperature of the secondary battery 2 is measured by the thermistor 7. The charging/discharging control unit 5a compares the environmental temperature measured by the thermistor 7 with the temperature characteristics shown in FIG. 7, calculates the backup guarantee SOC required for the current environmental temperature, and corrects both the backup guarantee voltage Vb and the charging termination voltage Vs on the basis of the calculated backup guarantee SOC, thus securing the capacity (Wh) required for backup regardless of the temperature of the secondary battery 2. That is, the charging/discharging control unit 5a sets the backup guarantee SOC of the secondary battery 2 for the normal period depending on the temperature of the secondary battery 2. Further, since the environmental temperature continuously varies, the temperature correction of the backup guarantee voltage Vb by the charging/discharging control unit 5a can be simplified if SOC levels required for respective predetermined temperature ranges have been defined, as shown in FIG. 8.

Second Embodiment

The configuration of a power supply apparatus in the present embodiment is identical to that of the first embodiment, so that the same reference numerals are assigned to identical components and redundant description thereof will be omitted.

In the present embodiment, during a normal period in which the secondary battery 2 is not used as a backup power source (a state in which current flows through the AC power source AC), the charging/discharging controller 5 determines the degraded state of the secondary battery 2 in consideration of the discharging time. The flowchart of the operations of the power supply apparatus performed during the normal period is shown in FIG. 9.

First, similarly to the first embodiment, the charging/discharging control unit 5a controls charging/discharging during the normal period at steps S1 to S3 by using the backup guarantee voltage Vb and the charging termination voltage Vs, and then returns to step S1 to repeat the process if the lifespan determination time, for example, once a month, has not been reached at step S4.

If the lifespan determination time for the secondary battery 2 has been reached, the charging/discharging control unit 5a makes the battery voltage identical to the lifespan determination voltage Vh by using the charging circuit 3, and starts to discharge the secondary battery 2 by using the compulsory discharging circuit 4b of the discharging circuit (step S15). The charging/discharging control unit 5a determines whether the battery voltage has decreased to the initial backup guarantee voltage Vb0 (step S16), and continues to perform a discharge operation if the battery voltage is greater than the initial backup guarantee voltage Vb0. Further, the timer unit 5b measures the time required to perform discharging from the lifespan determination voltage Vh to the initial backup guarantee voltage Vb0 (discharging time), so that the determination unit 5c determines the degraded state of the secondary battery 2 based on the discharging time if it is determined at step S16 that the battery voltage has decreased to the initial backup guarantee voltage Vb0 (step S17).

Hereinafter, a process for determining the degraded state of the secondary battery 2 will be described in detail.

Figure 10A:
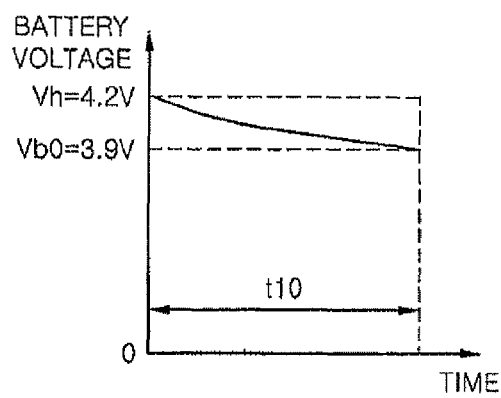
Figure 10B:
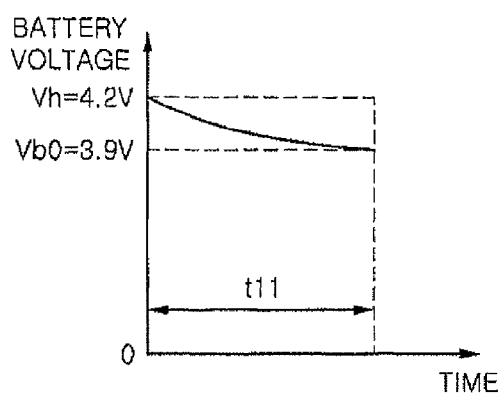

First, as shown in FIG. 10B, if a battery voltage of 3.9V corresponding to a first SOC 50% is the initial backup guarantee voltage Vb0 and a battery voltage of 4.2V corresponding to a second SOC 100% is the lifespan determination voltage Vh, the charging time from the lifespan determination voltage Vh to the initial backup guarantee voltage Vb0 (the measured discharging time) is assumed to be t11.

Further, the determination unit 5c stores initial discharging time t10 (the initial time required) it takes the initial secondary battery 2 to be discharged in a range of SOC 100%~50%, and determines the degraded state of the secondary battery 2 on the basis of the ratio of the measured discharging time t11 to the initial discharging time t10 (t11/t10). In this case, the degraded state is represented by the following Equation (5):

$$\text{Degraded state} = t11/t10 \quad (5)$$

As t11/t10 becomes less than 1, the secondary battery 2 is determined to be degraded. In this case, the process can be simplified compared to the determination process based on the capacity of the secondary battery 2, which will be described below.

Further, the determination unit 5c may determine the degraded state of the secondary battery 2, on the basis of the capacity of the secondary battery 2 that is derived in consideration of the discharging time. First, as shown in FIG. 10B, it is assumed that when a battery voltage of 3.9V corresponding to the first SOC 50% is the initial backup guarantee voltage Vb0, a battery voltage of 4.2V corresponding to the second SOC 100% is the lifespan determination voltage Vh, discharging power for compulsory discharging performed by the compulsory discharging circuit 4b is P11 W, and the discharge SOC that is a discharge portion of SOC is 50% (=100%-50%), the discharging time (the measured charging time) from the lifespan determination voltage Vh to the initial backup guarantee voltage Vb0 is t11. In this case, the capacity C11 (Wh) of the current secondary battery 2 in SOC 100% (hereinafter, referred to as a "measured capacity C11") is given by the following Equation (6):

$$C11(Wh) = t11(h) \times P11(W) \div \text{discharge SOC}(\%) \times 100 \quad (6).$$

Further, the determination unit 5c previously stores the capacity C10 (Wh) of the initial secondary battery 2 in SOC 100% (hereinafter, referred to as an "initial capacity C10"), and the degraded state of the secondary battery 2 is represented by the following Equation (7):

$$\text{Degraded state} = C11/C10 \quad (7)$$

That is, as C11/C10 becomes less than 1, the secondary battery 2 is determined to be degraded. In this way, by comparing the capacity C11 of the secondary battery 2 derived based on the discharging time with the initial capacity C10, it is possible to determine the degraded state of the secondary battery 2. Furthermore, for the initial capacity C10 (Wh) of the secondary battery 2, the initial discharging time t10 may be measured by using the initial secondary battery 2 (see FIG. 10A), and results obtained by calculating the following Equation (8) may be stored.

$$C10(Wh) = t10(h) \times P11(W) \div \text{discharge SOC}(\%) \times 100 \quad (8)$$

Further, the lifespan determination voltage Vh may be set to a battery voltage corresponding to, for example, SOC 60%, rather than SOC 100%. However, since the discharging time is decreased, discharging from a higher SOC level is more profitable from the standpoint of the accuracy of the determination.

Furthermore, the determination unit 5c determines whether the degraded state of the secondary battery 2 is in progress, based on the degraded state of the secondary battery 2 obtained in the above Equation (5) or (7) (step S18). When the degraded state has decreased to 0.9, the measured capacity C1 is decreased to 90% of the initial capacity C0, so that the capacity in SOC 100% is 90 Wh. Therefore, in order to secure a capacity of 50 Wh required for backup, a backup guarantee SOC of 56% is required.

Figure 10C:
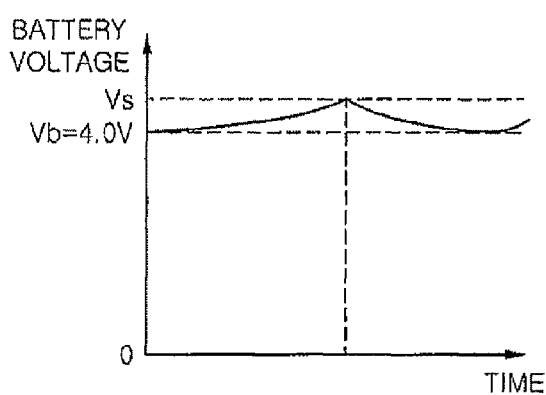

Therefore, the charging/discharging control unit 5a sets 4.0V corresponding to the backup guarantee SOC 56% as the backup guarantee voltage Vb, and then corrects the backup guarantee voltage Vb depending on the degraded state of the secondary battery 2 (step S19). Further, with the correction of the backup guarantee voltage Vb, the charging termination voltage Vs is also corrected. Thereafter, the charging/discharging control unit 5a controls charging/discharging during the normal period at steps S1 to S3 by using the corrected backup guarantee voltage Vb and the corrected charging termination voltage Vs (see FIG. 10C), thus securing a capacity of 50 Wh required for backup regardless of the degraded state of the secondary battery 2. That is, the charging/discharging control unit 5a sets the SOC of the secondary battery 2 for the normal period, depending on the degraded state of the secondary battery 2 determined by the determination unit 5c.

Further, the correction of the backup guarantee voltage Vb at steps S15 to S19 is periodically performed, and thus the correction of the charging termination voltage Vs is performed accordingly. When the measured capacity C1 (Wh) of the current secondary battery 2 in the SOC 100% decreases to 55 Wh, a notification of this decrease is provided to the user by using a notification unit (not shown) such as an indication lamp or a buzzer, and the user is prompted to replace the secondary battery 2.

Further, similarly to the first embodiment, the charging/discharging control unit 5a performs a temperature correction on the backup guarantee voltage Vb and the charging termination voltage Vs on the basis of the environmental temperature measured by the thermistor 7.

Furthermore, although, in the present embodiment, the configuration is simplified by using the compulsory discharging circuit 4b of the discharging circuit 4 for discharging at step S15, a discharging unit having a configuration different from that of the discharging circuit 4 may also be provided, and the power consumption of the load appliance L may be used for discharging.

Although the embodiments of the present invention have been described above, the present invention is not limited to these specific embodiments, but a variety of variations and modifications are possible without departing from the scope of the following claims and fall within the scope of the present invention.

What is claimed is:
1. A power supply apparatus comprising:
a backup battery;
a timer unit for measuring a first time required to charge the backup battery from a first State Of Charge (SOC) to a second SOC, or a second time required to discharge the backup battery from the second SOC to the first SOC;
a determination unit for determining a degree of degradation in a capacity of the backup battery based on the first time or the second time;
a charging unit for charging the backup battery;
a discharging unit for discharging the backup battery; and
a charging/discharging control unit configured to control charging of the backup battery by using the charging unit and discharging of the backup battery by using the discharging unit,
wherein the charging/discharging control unit controls the charging unit so that, at a predetermined timing, the backup battery is charged from the first SOC to the second SOC, or controls the discharging unit so that, at the predetermined timing, the backup battery is discharged from the second SOC to the first SOC.

2. The power supply apparatus of claim 1, wherein the determination unit is configured to store, as an initial charging time, a time required to initially charge the backup battery from the first SOC to the second SOC, or store, as an initial discharging time, a time required to initially discharge the backup battery from the second SOC to the first SOC, and then determines the degree of degradation of the backup battery by comparing the first time with the initial charging time or comparing the second time with the initial discharging time.

3. The power supply apparatus of claim 1, wherein the determination unit stores, as an initial capacity, a capacity of the backup battery obtained when the backup battery is initially in the second SOC, derives the capacity of the backup battery in the second SOC based on the first time or the second time, and determines the degree of degradation of the backup battery by comparing the derived capacity with the initial capacity.

4. The power supply apparatus of claim 1, wherein the backup battery is configured to be charged to a predetermined capacity or more and is then used as a backup power source configured to supply power to a load in case of emergency, and
wherein the charging/discharging control unit charges the backup battery to a backup guarantee SOC or more, and varies, depending on the determined degree of degradation of the backup battery, the backup guarantee SOC so that the backup battery is charged to the predetermined capacity or more.

5. The power supply apparatus of claim 1, wherein the charging/discharging control unit varies, depending on a temperature of the backup battery, the backup guarantee SOC so that the backup battery is charged to the predetermined capacity or more.

6. The power supply apparatus of claim 4, wherein the charging/discharging control unit controls, excepting at the predetermined timing, the charging unit and the discharging unit such that a voltage of the backup battery is equal or greater than a backup guarantee voltage which corresponds to the backup guarantee SOC and equal or less than a charging termination voltage, and
wherein the first SOC is equal to the backup guarantee SOC and a voltage of the backup battery corresponding to the second SOC is greater than the charging termination voltage.

7. The power supply apparatus of claim 1, wherein the charging/discharging control unit controls the discharging unit to charge the backup battery from the first SOC of less than 100% to the second SOC of 100% or controls the discharging unit to discharge the backup battery from the second SOC of 100% to the first SOC of less than 100%, at the predetermined timing.

8. The power supply apparatus of claim 1, wherein the backup battery is configured to be charged to a predetermined capacity or more and is used as a backup power source configured to supply power to a load in case of emergency, and
wherein the charging/discharging control unit charges the backup battery to a backup guarantee SOC or more, and varies, depending on a temperature of the backup battery, the backup guarantee SOC so that the backup battery is charged to the predetermined capacity or more.

9. The power supply apparatus of claim 1, wherein the determination unit is configured to determine a lifespan of the backup battery based on the determined degree of degradation.

10. The power supply apparatus of claim 1, wherein the discharging unit is a compulsory discharging unit configured to forcibly discharge the backup battery from the second SOC to the first SOC.

11. The power supply apparatus of claim 1, wherein the determination unit determines the degree of degradation based on a ratio of the first time to a time required to initially charge the backup battery from the first SOC to the second SOC, or a ratio of the second time to a time required to initially discharge the backup battery from the second SOC to the first SOC.

12. The power supply apparatus of claim 1, further comprising a notification unit configured to provide a notification to a user of the power supply apparatus when the degree of degradation of the backup battery reaches a predetermined value.

* * * * *